(12) United States Patent
Yin (10) Patent No.: US 9,484,920 B2
(45) Date of Patent: Nov. 1, 2016

(54) SWITCHING CIRCUIT AND ELECTRONIC DEVICE

(71) Applicant: HUAWEI TECHNOLOGIES CO., LTD., Shenzhen, Guangdong (CN)

(72) Inventor: Wei Yin, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/724,457

(22) Filed: May 28, 2015

(65) Prior Publication Data

US 2015/0349777 A1    Dec. 3, 2015

(30) Foreign Application Priority Data

May 30, 2014   (CN) .......................... 2014 1 0241139

(51) Int. Cl.
| | |
|---|---|
| *H03K 17/00* | (2006.01) |
| *H03K 19/0175* | (2006.01) |
| *H03K 5/24* | (2006.01) |
| *H04N 5/335* | (2011.01) |
| *H04N 5/232* | (2006.01) |

(52) U.S. Cl.
CPC ........ *H03K 19/017527* (2013.01); *H03K 5/24* (2013.01); *H04N 5/23203* (2013.01); *H04N 5/335* (2013.01)

(58) Field of Classification Search
None
See application file for complete search history.

(56) References Cited

U.S. PATENT DOCUMENTS

| | | | |
|---|---|---|---|
| 4,236,546 A | | 12/1980 | Manley et al. |
| 5,703,415 A | * | 12/1997 | Tanaka .................... G11C 5/141 307/66 |
| 6,642,750 B1 | * | 11/2003 | Egan ........................ H02J 1/08 327/63 |
| 2010/0141048 A1 | | 6/2010 | Hou |

FOREIGN PATENT DOCUMENTS

CN          101751057 A     6/2010

* cited by examiner

*Primary Examiner* — Long Nguyen
(74) *Attorney, Agent, or Firm* — Leydig, Voit & Mayer, Ltd.

(57) ABSTRACT

The present invention provides a switching circuit and an electronic device, which relate to the field of electronic technologies, so as to improve reliability of image processing. The switching circuit includes a comparator circuit, a first switch circuit, a second switch circuit, a first drive voltage source, and a second drive voltage source. Two input ends of the comparator circuit respectively receive an input voltage and a reference voltage, an output end is separately connected to an input end of the first switch circuit and an input end of the second switch circuit; The comparator circuit determines whether the input voltage is greater than the reference voltage, outputs a high level when determining that the input voltage is greater than the reference voltage, and outputs a low level when determining that the input voltage is not greater than the reference voltage.

10 Claims, 7 Drawing Sheets

SWITCHING CIRCUIT AND ELECTRONIC DEVICE

CROSS-REFERENCE TO RELATED APPLICATION

This application claims priority to Chinese Patent Application No. 201410241139.5, filed on May 30, 2014, which is hereby incorporated by reference in its entirety.

TECHNICAL FIELD

The present invention relates to the field of electronic technologies, and in particular, to a switching circuit and an electronic device.

BACKGROUND

An image sensor is an important part of a camera. Generally, the image sensor is comprised of an image sensor board including an image sensing chip and a core board including a main chip. Currently, voltages of interface levels of most image sensing chips are 1.8 V and 2.8 V, and voltages of interface levels of the main chip are 1.8 V and 3.3 V. Because used voltages of interface levels are different, a voltage of an interface level between the image sensing chip and the main chip needs to be converted.

Figure 1:
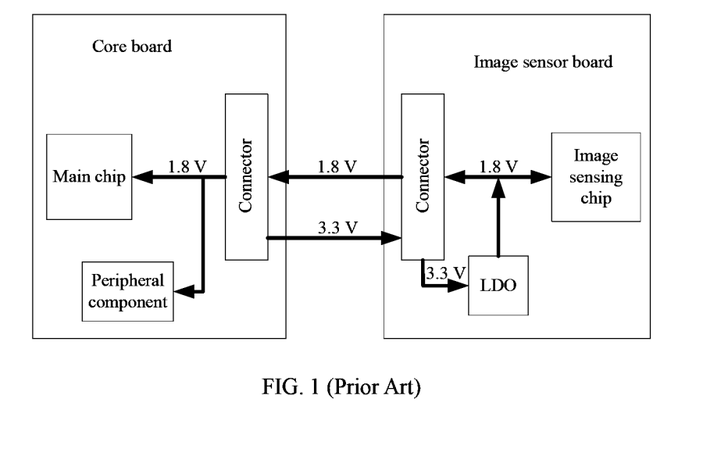
FIG. 1 is a schematic diagram of voltage conversion of an interface level between an image sensing chip and a main chip according to the prior art.
Figure 2:
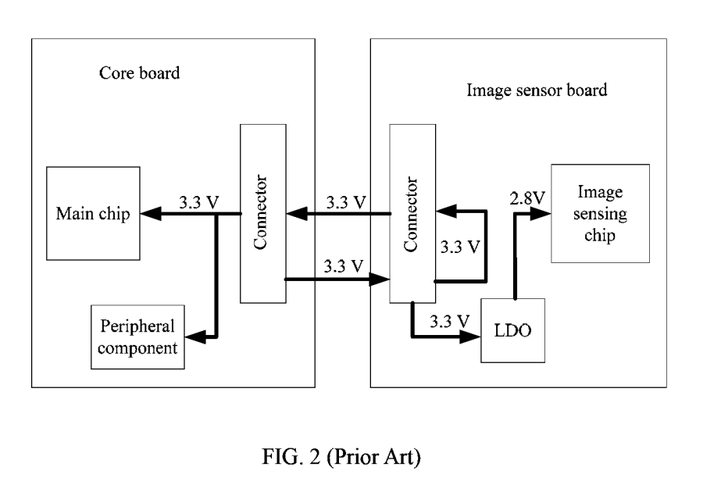
FIG. 2 is another schematic diagram of voltage conversion of an interface level between an image sensing chip and a main chip according to the prior art.

The prior art provides a method for implementing voltage conversion of an interface level between an image sensing chip and a main chip. In the voltage conversion method, several pins are defined on a connector between a core board and an image sensor board; when a voltage of an interface level of the image sensing chip is 1.8 V, as shown in FIG. 1, the image sensor board converts, by using an LDO (Low Dropout Regulator), a 3.3 V voltage received from the core board into 1.8 V to provide to the image sensing chip, and transmits, by using a connection cable, the converted 1.8 V voltage to a voltage control module in a connector of the main chip, so that a working voltage of the main chip is controlled at 1.8 V; when the voltage of the interface level of the image sensing chip is 2.8 V, as shown in FIG. 2, the image sensor board converts, by using the LDO, a 3.3 V voltage received from the core board into 2.8 V to provide to the image sensing chip, and transmits, by using the connection cable, the received 3.3 V voltage received from the core board to the voltage control module in the connector of the main chip, so that the working voltage of the main chip is controlled at 3.3 V.

In the foregoing process of implementing voltage conversion of the interface level between the image sensing chip and the main chip, in the process of transmission from the image sensor board to the core board, because a current on the connection cable between the image sensor board and the core board is relative large, a voltage received by the core board is attenuated, and when the voltage is excessively attenuated, a working voltage of the main chip is not ensured, thereby reducing reliability of image processing.

SUMMARY

Embodiments of the present invention provide a switching circuit and an electronic device, so as to ensure a working voltage of a main chip, and improve reliability of image processing.

To achieve the foregoing objectives, the following technical solutions are used in the embodiments of the present invention:

According to a first aspect, an embodiment of the present invention provides a switching circuit, including a comparator circuit, a first switch circuit, a second switch circuit, a first drive voltage source, and a second drive voltage source, where the comparator circuit includes a first input end, a second input end, and an output end; the first switch circuit and the second switch circuit both include an input end, an output end, and a drive end; the first input end of the comparator circuit is configured to receive an input voltage; the second input end of the comparator circuit is configured to receive a reference voltage; the output end of the comparator circuit is separately connected to the input end of the first switch circuit and the input end of the second switch circuit; the drive end of the first switch circuit is connected to the first drive voltage source; the drive end of the second switch circuit is connected to the second drive voltage source; the comparator circuit is configured to determine whether the input voltage is greater than the reference voltage, output a high level if it is determined that the input voltage is greater than the reference voltage, and output a low level if it is determined that the input voltage is not greater than the reference voltage; the first switch circuit is configured to, when the comparator circuit outputs the high level, switch on and output, by using the output end of the first switch circuit, a first drive voltage provided by the first drive voltage source, and switch off when the comparator circuit outputs the low level; and the second switch circuit is configured to, when the comparator circuit outputs the low level, switch on and output, by using the output end of the second switch circuit, a second drive voltage provided by the second drive voltage source, and switch off when the comparator circuit outputs the high level.

In a first possible implementation manner of the first aspect, the first switch circuit includes a first NPN transistor, a first resistor, a first P-channel field-effect transistor, and a second resistor; the output end of the comparator circuit is connected to a base of the first NPN transistor; an emitter of the first NPN transistor is grounded; a collector of the first NPN transistor is connected to one end of the first resistor; the other end of the first resistor is connected to a gate of the first P-channel field-effect transistor; a source of the first P-channel field-effect transistor is connected to the first drive voltage source; a drain of the first P-channel field-effect transistor is configured to output the first drive voltage; one end of the second resistor is connected to the source of the first P-channel field-effect transistor; and the other end of the second resistor is connected to the gate of the first P-channel field-effect transistor.

With reference to the first aspect or the first possible implementation manner of the first aspect, in a second possible implementation manner of the first aspect, the second switch circuit includes a second NPN transistor, a third NPN transistor, a controlled voltage source, a third resistor, a second P-channel field-effect transistor, and a fourth resistor; the output end of the comparator circuit is connected to a base of the second NPN transistor; an emitter of the second NPN transistor is grounded; a collector of the second NPN transistor is connected to a base of the third NPN transistor; the base of the third NPN transistor is connected to the controlled voltage source; an emitter of the third NPN transistor is grounded; a collector of the third NPN transistor is connected to one end of the third resistor; the other end of the third resistor is connected to a gate of the second P-channel field-effect transistor; a source of the second P-channel field-effect transistor is connected to the second drive voltage source; a drain of the second P-channel field-effect transistor is configured to output the second drive voltage; one end of the fourth resistor is connected to the source of the second P-channel field-effect transistor; and the other end of the fourth resistor is connected to the gate of the second P-channel field-effect transistor.

With reference to the first or the second possible implementation manner of the first aspect, in a third possible implementation manner of the first aspect, the first switch circuit further includes a fifth resistor and a first capacitor; the fifth resistor is connected in series between the output end of the comparator circuit and the base of the first NPN transistor; and one end of the first capacitor is connected to the base of the first NPN transistor, and the other end of the first capacitor is grounded.

With reference to the second or the third possible implementation manner of the first aspect, in a fourth possible implementation manner of the first aspect, the second switch circuit further includes a sixth resistor and a second capacitor; the sixth resistor is connected in series between the collector of the second NPN transistor and the base of the third NPN transistor; and one end of the second capacitor is connected to the base of the third NPN transistor, and the other end of the second capacitor is grounded.

With reference to the first aspect or any one of the first to the fourth possible implementation manners of the first aspect, in a fifth possible implementation manner of the first aspect, the reference voltage is generated in a manner of a low dropout regulator LDO or pulse width modulation PWM.

According to a second aspect, an embodiment of the present invention provides an electronic device, including a processor, a connector, and the switching circuit in the foregoing embodiment, where the processor is separately connected to an output end of a first switch circuit and an output end of a second switch circuit in the switching circuit; and the connector is connected to a first input end of a comparator circuit in the switching circuit.

In a first possible implementation manner of the second aspect, the connector is configured to receive an input signal from an image sensor board, and transmit the input signal to the switching circuit.

With reference to the second aspect or the first possible implementation manner of the second aspect, in a second possible implementation manner of the second aspect, the processor includes an image processing chip.

With reference to the second aspect or the first or the second possible implementation manner of the second aspect, in a third possible implementation manner of the second aspect, the input signal of the image sensor board is configured to control a working voltage of the processor in the electronic device.

The embodiments of the present invention provide a switching circuit and an electronic device, where the switching circuit includes a comparator circuit, a first switch circuit, a second switch circuit, a first drive voltage source, and a second drive voltage source. The comparator circuit includes a first input end, a second input end, and an output end; the first switch circuit and the second switch circuit both include an input end, an output end, and a drive end. The first input end of the comparator circuit is configured to receive an input voltage; the second input end of the comparator circuit is configured to receive a reference voltage; the output end of the comparator circuit is separately connected to the input end of the first switch circuit and the input end of the second switch circuit; the drive end of the first switch circuit is connected to the first drive voltage source; the drive end of the second switch circuit is connected to the second drive voltage source. The comparator circuit is configured to determine whether the input voltage is greater than the reference voltage, output a high level if it is determined that the input voltage is greater than the reference voltage, and output a low level if it is determined that the input voltage is not greater than the reference voltage. The first switch circuit is configured to, when the comparator circuit outputs the high level, switch on and output, by using the output end of the first switch circuit, a first drive voltage provided by the first drive voltage source, and switch off when the comparator circuit outputs the low level; and the second switch circuit is configured to, when the comparator circuit outputs the low level, switch on and output, by using the output end of the second switch circuit, a second drive voltage provided by the second drive voltage source, and switch off when the comparator circuit outputs the high level. In this way, regardless of whether a received voltage is attenuated, the switching circuit only needs to output the first drive voltage if the received voltage is greater than the reference voltage, and output the second drive voltage if the received voltage is less than the reference voltage, thereby ensuring that a working voltage of a main chip is the first drive voltage or the second drive voltage, reducing attenuation of a voltage during transmission on a connection cable between an image sensor board and a core board, and improving reliability of image processing.

BRIEF DESCRIPTION OF DRAWINGS

To describe the technical solutions in the embodiments of the present invention more clearly, the following briefly introduces the accompanying drawings required for describing the embodiments or the prior art. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

The following clearly describes the technical solutions in the embodiments of the present invention with reference to the accompanying drawings in the embodiments of the present invention. Apparently, the described embodiments are merely some but not all of the embodiments of the present invention. All other embodiments obtained by a person of ordinary skill in the art based on the embodiments of the present invention without creative efforts shall fall within the protection scope of the present invention.

Figure 3:
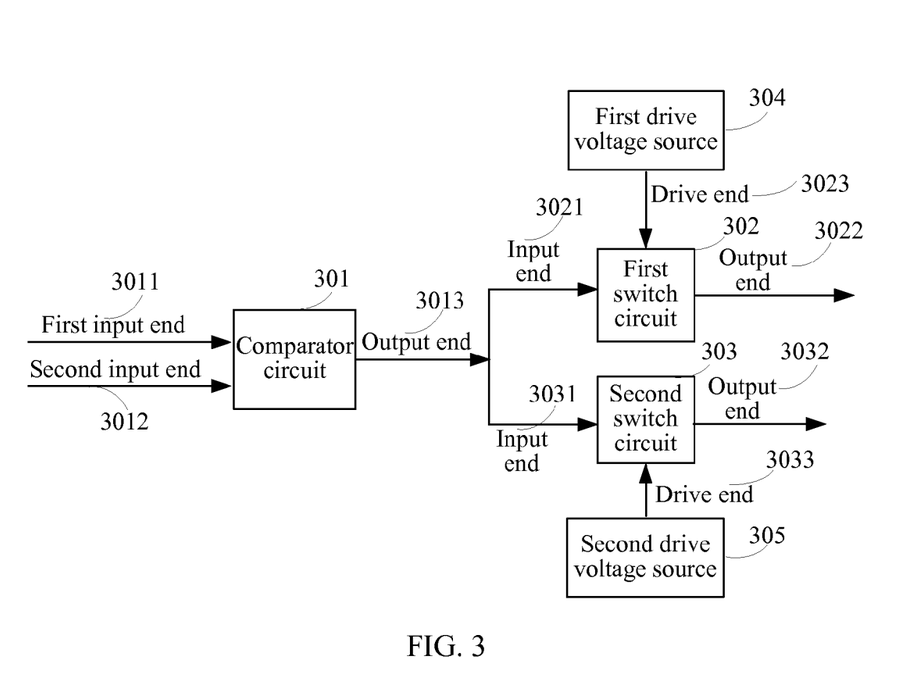
FIG. 3 is a schematic diagram of a switching circuit according to an embodiment of the present invention.

An embodiment of the present invention provides a switching circuit; as shown in FIG. 3, the switching circuit includes a comparator circuit 301, a first switch circuit 302, a second switch circuit 303, a first drive voltage source 304, and a second drive voltage source 305.

The comparator circuit 301 includes a first input end 3011, a second input end 3012, and an output end 3013. The first switch circuit 302 includes an input end 3021, an output end 3022, and a drive end 3023. The second switch circuit 303 includes an input end 3031, an output end 3032, and a drive end 3033.

The output end 3013 of the comparator circuit is separately connected to the input end 3021 of the first switch circuit and the input end 3031 of the second switch circuit; the drive end 3023 of the first switch circuit is connected to the first drive voltage source 304; the drive end 3033 of the second switch circuit is connected to the second drive voltage source 305.

The first input end 3011 of the comparator circuit is configured to receive an input voltage.

It should be noted that, an input voltage represents two voltage values, but a specific voltage value of the input voltage is uncertain. For example, the input voltage represents two voltage values 1.8 V and 3.3 V; when the input voltage represents 1.8 V, a specific voltage value of the input voltage may be 1.5 V, or 1.7 V, or 1.6 V; when the input voltage represents 3.3 V, a specific voltage value of the input voltage may be 3.3 V, or 3.2 V, or 2.9 V. The switching circuit converts received voltages representing two voltage values into two fixed voltages. Exemplarily, when a 1.5 V, or 1.7 V, or 1.6 V voltage is received, a 1.8 V voltage is output; when a 3.3 V, or 3.2 V, or 2.9 V voltage is received, a 3.3 V voltage is output.

The second input end 3012 of the comparator circuit is configured to receive a reference voltage.

Generally, the reference voltage is determined according to the input voltage. A value of the reference voltage is between the two voltage values represented by the input voltage. For example, when the input voltage represents two voltage values 1.8 V and 3.3 V, a set reference voltage value is greater than 1.8 and less than 3.3.

Optimally, the value of the reference voltage is slightly less than an average value of the two voltage values represented by the input voltage. For example, when the input voltage represents two voltage values 1.8 V and 3.3 V, the reference voltage value may be set to 2.5 V.

Further, the reference voltage may be generated in an LDO (Low Dropout Regulator) manner, or may be generated in a PWM (Pulse Width Modulation) manner, or may be generated in a manner of a direct connection to a voltage source that can provide a reference voltage, which is not limited in the present invention.

The comparator circuit 301 is configured to determine whether the input voltage is greater than the reference voltage, output a high level if it is determined that the input voltage is greater than the reference voltage, and output a low level if it is determined that the input voltage is not greater than the reference voltage.

It should be noted that, the comparator circuit 301 is configured to determine that the input voltage represents which voltage value in the two voltage values. Therefore, the foregoing "the comparator circuit is configured to determine whether the input voltage is greater than the reference voltage" may also be equivalent to "the comparator circuit is configured to determine whether the input voltage is less than the reference voltage", and may also be equivalent to "the comparator circuit is configured to determine values of the input voltage and the reference voltage", or be another statement that can describe a usage of the comparator circuit 301. A specific form of the foregoing statement is not limited in the present invention.

Specifically, the comparator circuit 301 includes a comparator.

The comparator is an electronic element that outputs a different voltage result at an output end by comparing values of currents or voltages of two input ends. It should be noted that, when the comparator circuit 301 is a comparator, the first input end 3011 of the comparator circuit is a non-inverting input end of the comparator, the second input end 3012 of the comparator circuit is an inverting input end of the comparator, and the output end 3013 of the comparator circuit is an output end of the comparator.

It should be noted that, the comparator circuit 301 may not only be implemented by a comparator that has been integrated in the prior art, but also be implemented by a combination of various components such as a resistor, a capacitor, and an inductor, which is not limited in the present invention.

The first switch circuit 302 is configured to, when the comparator circuit 301 outputs the high level, switch on and output, by using the output end 3022 of the first switch circuit, a first drive voltage provided by the first drive voltage source 304; and switch off when the comparator circuit 301 outputs the low level.

It should be noted that, a voltage value of the first drive voltage provided by the first drive voltage source 304 is equal to a larger voltage value in two fixed voltage values that need to be output by the switching circuit. For example, when a voltage that needs to be output by the switching circuit is 1.8 V or 3.3 V, a voltage value provided by the first drive voltage source 304 is 3.3 V.

It should be noted that, the first switch circuit 302 switches on when the input voltage is greater than the reference voltage, so as to output the first drive voltage, thereby implementing that when the input voltage is greater than the reference voltage, the input voltage is switched to the first drive voltage.

Figure 4:
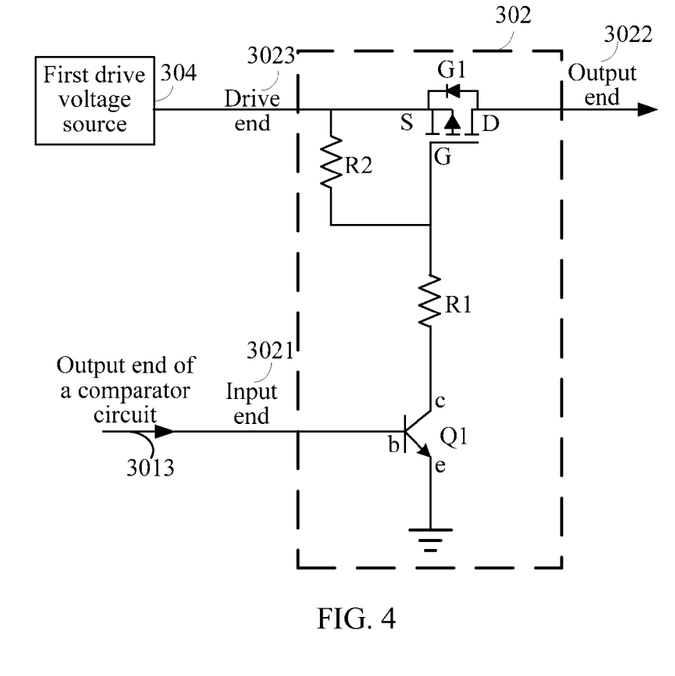
FIG. 4 is a schematic diagram of a first switch circuit according to an embodiment of the present invention.

Specifically, as shown in FIG. 4, the first switch circuit 302 includes a first NPN transistor Q1, a first resistor R1, a first P-channel field-effect transistor G1, and a second resistor R2.

The output end 3013 of the comparator circuit is connected to a base of the first NPN transistor Q1; an emitter of the first NPN transistor Q1 is grounded; a collector of the first NPN transistor Q1 is connected to one end of the first resistor R1; the other end of the first resistor R1 is connected to a gate of the first P-channel field-effect transistor G1; a source of the first P-channel field-effect transistor G1 is connected to the first drive voltage source 304; a drain of the first P-channel field-effect transistor G1 is configured to output the first drive voltage; one end of the second resistor R2 is connected to the source of the first P-channel field-effect transistor G1; and the other end of the second resistor R2 is connected to the gate of the first P-channel field-effect transistor G1.

It should be noted that, in this case it is necessary to ensure that the first drive voltage is greater than a voltage divided by the first resistor R1 after the comparator circuit outputs the high level.

When the comparator circuit 301 outputs the high level, the first NPN transistor Q1 switches on; when the comparator circuit 301 outputs the high level, a voltage is divided by the first resistor R1 and then connected to the gate of the first P-channel field-effect transistor G1; in this case, a gate voltage of the first P-channel field-effect transistor G1 is less than a source voltage of the first P-channel field-effect transistor G1, the first P-channel field-effect transistor G1 switches on, and the drain of the first P-channel field-effect transistor G1 outputs the first drive voltage.

When the comparator circuit 301 outputs the low level, the first NPN transistor Q1 is cut off, the first P-channel field-effect transistor G1 is cut off, and the drain of the first P-channel field-effect transistor G1 does not output a voltage.

It should be noted that, the foregoing provides only one implementation manner of the first switch circuit 302, and the first switch circuit 302 may also be implemented by a relay. A specific implementation manner of the first switch circuit 302 is not limited in the present invention.

Figure 5:
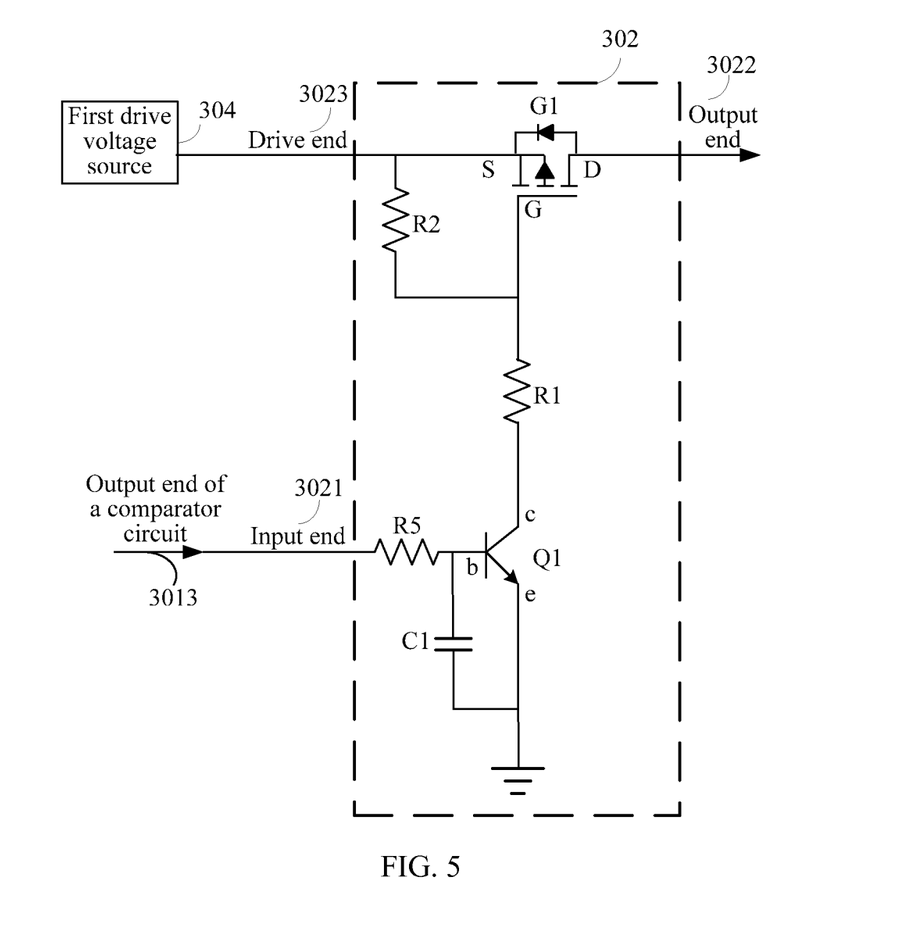
FIG. 5 is another schematic diagram of a first switch circuit according to an embodiment of the present invention.

Further, on a basis of FIG. 4, a delay circuit is added to improve reliability of an output. The delay circuit is configured to delay a switch-on time of the first switch circuit, so that the first switch circuit may change from cut-off to switch-on only after the second switch circuit first changes from switch-on to cut-off, thereby avoiding an output exception that may occur when the first switch circuit and the second switch circuit switch on at the same time. Specifically, as shown in FIG. 5, the first switch circuit 302 further includes a fifth resistor R5 and a first capacitor C1.

The fifth resistor R5 is connected in series between the output end 3013 of the comparator circuit and the base of the first NPN transistor Q1; one end of the first capacitor C1 is connected to the base of the first NPN transistor Q1, and the other end of the first capacitor C1 is grounded.

It should be noted that, in this case the output end 3013 of the comparator circuit is not directly connected to the base of the first NPN transistor Q1, and instead, is connected by using the fifth resistor R5. That is, the output end 3013 of the comparator circuit is connected to one end of the fifth resistor R5, and the base of the first NPN transistor Q1 is connected to the other end of the fifth resistor R5.

It should be noted that, a delay time may be changed by adjusting values of a capacitor and a resistor. The delay time may be obtained by calculation according to a formula $-R*C*\ln[(E-V)/E]$, where "−" is a negative sign; a unit of R is Ohm Ω, a unit of C is Farad F, E is a voltage between a resistor connected in series and a capacitor, and V is a voltage to be achieved between capacitors.

The second switch circuit 303 is configured to, when the comparator circuit 301 outputs the low level, switch on and output, by using the output end 3032 of the second switch circuit, a second drive voltage provided by the second drive voltage source 305; and switch off when the comparator circuit 301 outputs the high level.

It should be noted that, a voltage value of the second drive voltage provided by the second drive voltage source 305 is equal to a smaller voltage value in the two fixed voltage values that need to be output by the switching circuit. For example, when a voltage that needs to be output by the switching circuit is 1.8 V or 3.3 V, a voltage value provided by the second drive voltage source 305 is 1.8 V.

It should be noted that, the second switch circuit 303 switches on when the input voltage is not greater than the reference voltage, so as to output the second drive voltage, thereby implementing that when the input voltage is not greater than the reference voltage, the input voltage is switched to the second drive voltage.

Figure 6:
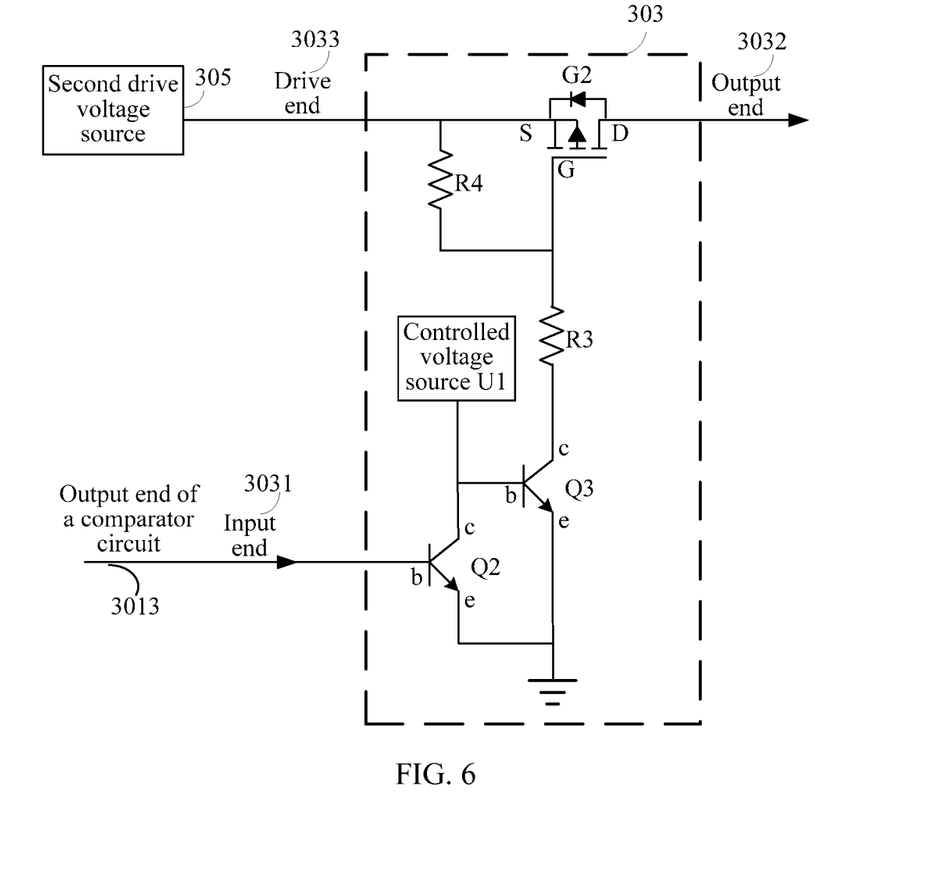
FIG. 6 is a schematic diagram of a second switch circuit according to an embodiment of the present invention.

Further, as shown in FIG. 6, the second switch circuit 303 includes a second NPN transistor Q2, a third NPN transistor Q3, a controlled voltage source U1, a third resistor R3, a second P-channel field-effect transistor G2, and a fourth resistor R4.

The output end 3013 of the comparator circuit is connected to a base of the second NPN transistor Q2; an emitter of the second NPN transistor Q2 is grounded; a collector of the second NPN transistor Q2 is connected to a base of the third NPN transistor Q3; the base of the third NPN transistor Q3 is connected to the controlled voltage source U1; an emitter of the third NPN transistor Q3 is grounded; a collector of the third NPN transistor Q3 is connected to one end of the third resistor R3, the other end of the third resistor R3 is connected to a gate of the second P-channel field-effect transistor G2; a source of the second P-channel field-effect transistor G2 is connected to the second drive voltage source 305; a drain of the second P-channel field-effect transistor G2 is configured to output the second drive voltage; one end of the fourth resistor R4 is connected to the source of the second P-channel field-effect transistor G2; and the other end of the fourth resistor R4 is connected to the gate of the second P-channel field-effect transistor G2.

It should be noted that, the controlled voltage source U1 outputs a voltage, where the voltage enters the base of the third NPN transistor Q3, and is configured to, when the comparator circuit 301 outputs the low level, enable the third NPN transistor Q3 and the second P-channel field-effect transistor G2 to switch on, so that the drain of the second P-channel field-effect transistor G2 outputs the second drive voltage.

It should be noted that, in this case it is necessary to ensure that the second drive voltage is greater than a voltage that is provided by the controlled voltage source U1 and divided by the third resistor R3.

When the comparator circuit 301 outputs the high level, the second NPN transistor Q2 switches on, that is, the emitter and the collector of the second NPN transistor Q2 switch on; in this case, the emitter of the second NPN transistor Q2 is grounded, and the collector of the second NPN transistor Q2 is connected to the base of the third NPN transistor Q3, and therefore, the base of the third NPN transistor Q3 is grounded. In addition, because the emitter of the third NPN transistor Q3 is grounded, the third NPN transistor Q3 is cut off, which causes that the second P-channel field-effect transistor G2 is cut off, and finally makes the drain of the second P-channel field-effect transistor G2 not output a voltage.

When the comparator circuit 301 outputs the low level, the second NPN transistor Q2 is cut off; in this case, because the base of the third NPN transistor Q3 is connected to the controlled voltage source U1, the third NPN transistor Q3 switches on, so that the second P-channel field-effect transistor G2 switches on, and the second P-channel field-effect transistor G2 outputs the second drive voltage.

It should be noted that, the foregoing provides only one implementation manner of the second switch circuit 303, and the second switch circuit 303 may also be implemented by a relay. A specific implementation manner of the second switch circuit 303 is not limited in the present invention.

Figure 7:
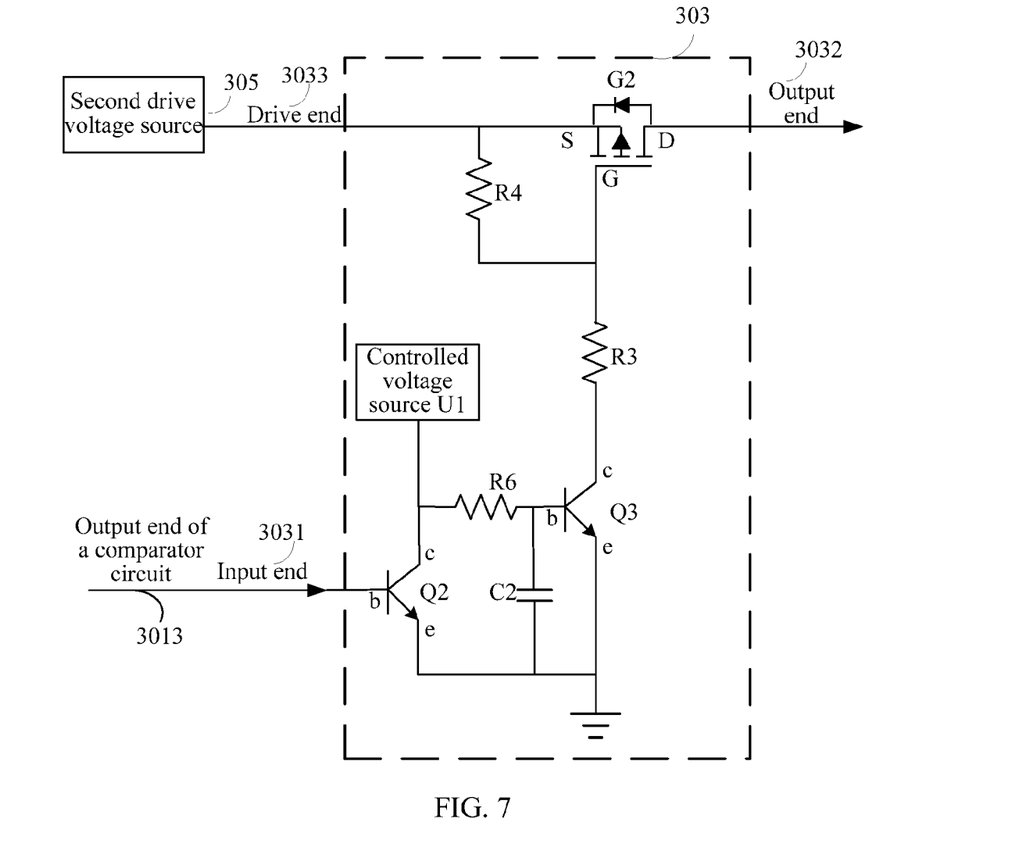
FIG. 7 is another schematic diagram of a second switch circuit according to an embodiment of the present invention.

Further, on a basis of FIG. 6, a delay circuit is added to improve reliability of an output. The delay circuit is configured to delay a switch-on time of the second switch circuit, so that the second switch circuit may change from cut-off to switch-on only after the first switch circuit first changes from switch-on to cut-off, thereby avoiding an output exception that may occur when the first switch circuit and the second switch circuit switch on at the same time.

Specifically, as shown in FIG. 7, the second switch circuit 303 further includes a sixth resistor R6 and a second capacitor C2.

The sixth resistor R6 is connected in series between the collector of the second NPN transistor Q2 and the base of the third NPN transistor Q3; one end of the second capacitor is connected to the base of the third NPN transistor Q3; the other end of the second capacitor C2 is grounded.

It should be noted that, in this case the collector of the second NPN transistor Q2 is not directly connected to the base of the third NPN transistor Q3, and instead, is connected by using the sixth resistor R6. That is, the collector of the second NPN transistor Q2 is connected to one end of the sixth resistor R6, and the base of the third NPN transistor Q3 is connected to the other end of the sixth resistor R6.

It should be noted that, a delay time may be changed by adjusting values of a capacitor and a resistor. A formula for calculating the delay time is the same as the formula for calculating the delay time according to the fifth resistor R5 and the first capacitor C1, and details are not described herein again.

Figure 8:
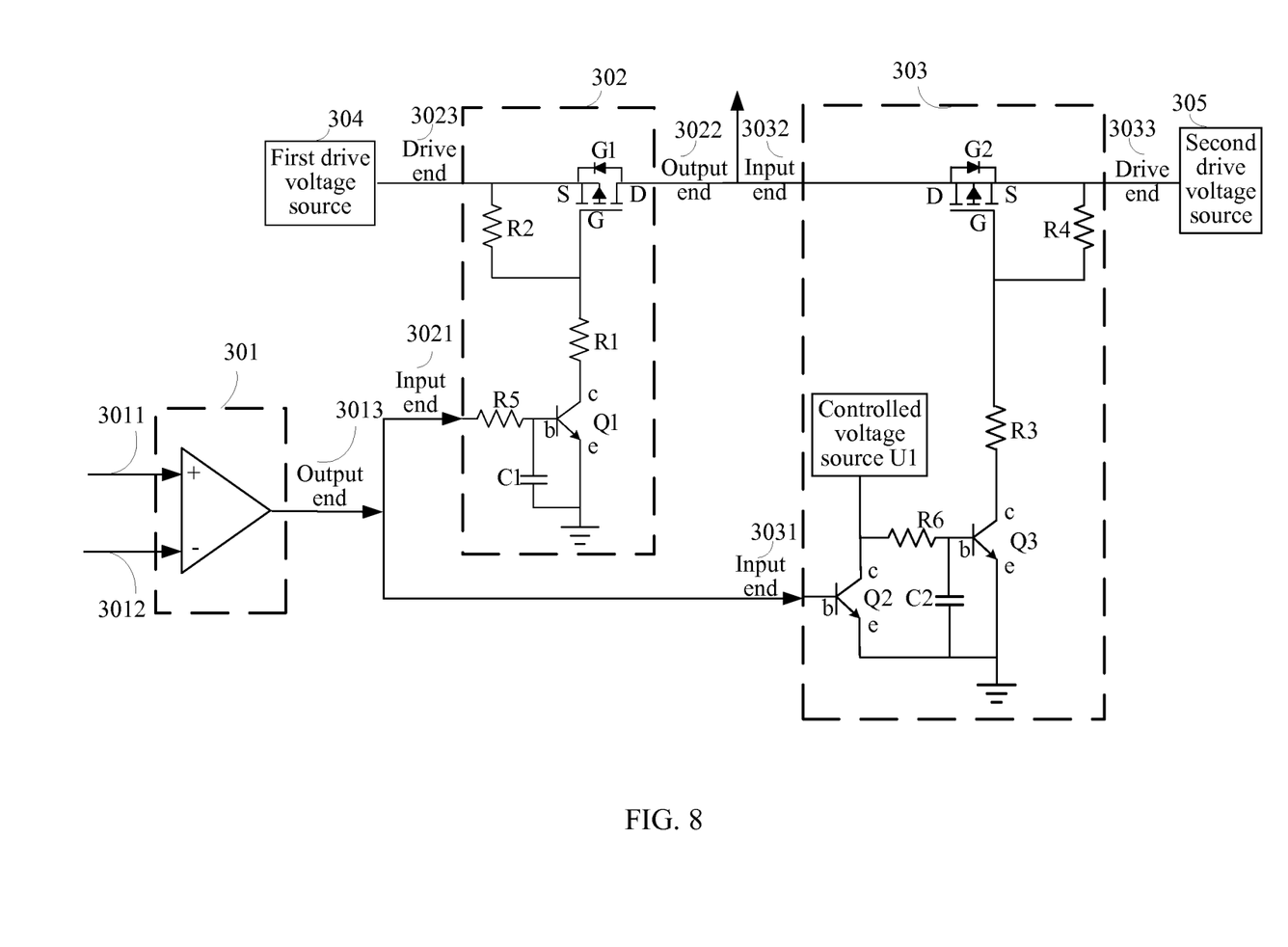
FIG. 8 is another schematic diagram of a switching circuit according to an embodiment of the present invention.

Further, the first switch circuit 302 in FIG. 5, the second switch circuit 303 in FIG. 7, and the comparator circuit 301 that is a comparator are added to the switching circuit shown in FIG. 3 to form another switching circuit shown in FIG. 8.

This embodiment of the present invention provides a switching circuit, including a comparator circuit, a first switch circuit, a second switch circuit, a first drive voltage source, and a second drive voltage source, where the comparator circuit includes a first input end, a second input end, and an output end; the first switch circuit and the second switch circuit both include an input end, an output end, and a drive end; the first input end of the comparator circuit is configured to receive an input voltage; the second input end of the comparator circuit is configured to receive a reference voltage; the output end of the comparator circuit is separately connected to the input end of the first switch circuit and the input end of the second switch circuit; the drive end of the first switch circuit is connected to the first drive voltage source; the drive end of the second switch circuit is connected to the second drive voltage source; the comparator circuit is configured to determine whether the input voltage is greater than the reference voltage, output a high level if it is determined that the input voltage is greater than the reference voltage, and output a low level if it is determined that the input voltage is not greater than the reference voltage; the first switch circuit is configured to, when the comparator circuit outputs the high level, switch on and output a first drive voltage by using the output end of the first switch circuit, and switch off when the comparator circuit outputs the low level; and the second switch circuit is configured to, when the comparator circuit outputs the low level, switch on and output a second drive voltage by using the output end of the second switch circuit, and switch off when the comparator circuit outputs the high level. In this way, regardless of whether a received voltage is attenuated, the switching circuit only needs to output the first drive voltage if the received voltage is greater than the reference voltage, and output the second drive voltage if the received voltage is less than the reference voltage, thereby ensuring that a working voltage of a main chip is the first drive voltage or the second drive voltage, and improving reliability of image processing.

Figure 9:
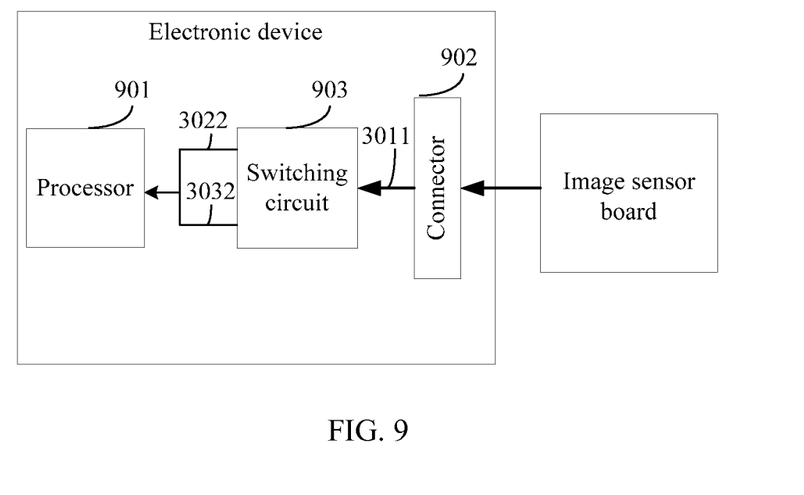
FIG. 9 is a schematic diagram of an electronic device according to an embodiment of the present invention.

An embodiment of the present invention provides an electronic device; as shown in FIG. 9, the electronic device includes a processor 901, a connector 902, and a switching circuit 903.

The processor 901 is separately connected to an output end 3022 of a first switch circuit and an output end 3032 of a second switch circuit in the switching circuit 903; the connector 902 is connected to a first input end 3011 of a comparator circuit in the switching circuit 903.

The switching circuit 903 is any one of the switching circuits in the foregoing embodiments.

Further, the connector 902 is configured to receive an input signal from an image sensor board (for example, a sensor board of a sensor), and transmit the input signal to the switching circuit. If the input signal of the image sensor board is greater than a reference voltage, the switching circuit 903 provides a first drive voltage to the processor 901; if the input signal is not greater than the reference voltage, the switching circuit 903 provides a second drive voltage to the processor 901. In this way, the electronic device may flexibly control, according to the input signal of the image sensor board, a working voltage of the processor 901 in the electronic device to be the first drive voltage or the second drive voltage.

Further, the processor 901 includes an image processing chip 904.

This embodiment of the present invention provides an electronic device, including a processor, a connector, and a switching circuit, where the switching circuit converts a received voltage into a voltage required by the processor, thereby ensuring that a working voltage of a main chip is a first drive voltage or a second drive voltage, improving reliability of image processing, and reducing attenuation of a voltage during transmission on a connection cable between an image sensor board and a core board.

In the several embodiments provided in the present application, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual needs to achieve the objectives of the solutions of the embodiments.

In addition, functional units in the embodiments of the present invention may be integrated into one processing unit, or each of the units may exist alone physically, or two or more units are integrated into one unit. The integrated unit may be implemented in a form of hardware, or may be implemented in a form of hardware in addition to a software functional unit.

Moreover, a word "connect" involved in the embodiments may be an indirect connection, and may not only indicate a direct connection between units or components by using a wire, but also indicate a connection by using another module or component.

Finally, it should be noted that the foregoing embodiments are merely intended for describing the technical solutions of the present invention but not for limiting the present invention. Although the present invention is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of the embodiments of the present invention.

What is claimed is:

1. A switching circuit, comprising a comparator circuit, a first switch circuit, a second switch circuit, a first drive voltage source, and a second drive voltage source, wherein the comparator circuit comprises a first input end, a second input end, and an output end; the first switch circuit and the second switch circuit both comprise an input end, an output end, and a drive end;
   the first input end of the comparator circuit is configured to receive an input voltage;
   the second input end of the comparator circuit is configured to receive a reference voltage;
   the output end of the comparator circuit is separately connected to the input end of the first switch circuit and the input end of the second switch circuit;
   the drive end of the first switch circuit is connected to the first drive voltage source;
   the drive end of the second switch circuit is connected to the second drive voltage source;
   the comparator circuit is configured to determine whether the input voltage is greater than the reference voltage; output a high level if it is determined that the input voltage is greater than the reference voltage; and output a low level if it is determined that the input voltage is not greater than the reference voltage;
   the first switch circuit is configured to, when the comparator circuit outputs the high level, switch on and output, by using the output end of the first switch circuit, a first drive voltage provided by the first drive voltage source; and switch off when the comparator circuit outputs the low level; and
   the second switch circuit is configured to, when the comparator circuit outputs the low level, switch on and output, by using the output end of the second switch circuit, a second drive voltage provided by the second drive voltage source; and switch off when the comparator circuit outputs the high level,
   wherein the first switch circuit comprises a first NPN transistor and a first P-channel field-effect transistor, the first NPN transistor is configured to receive output of the comparator circuit to control conductance of the first P-channel field-effect transistor, and thus control conductance of the first switch circuit,
   wherein the second switch circuit comprises a second NPN transistor, a third NPN transistor and a second P-channel field-effect transistor, the second NPN transistor is configured to receive the output of the comparator circuit to control conductance of the third NPN transistor and the second P-channel field-effect transistor, and thus control the conductance of second switch circuit.

2. The switching circuit according to claim 1, wherein the first switch circuit comprises the first NPN transistor, a first resistor, the first P-channel field-effect transistor, and a second resistor;
   the output end of the comparator circuit is connected to a base of the first NPN transistor;
   an emitter of the first NPN transistor is grounded;
   a collector of the first NPN transistor is connected to one end of the first resistor;
   the other end of the first resistor is connected to a gate of the first P-channel field-effect transistor;
   a source of the first P-channel field-effect transistor is connected to the first drive voltage source;
   a drain of the first P-channel field-effect transistor is configured to output the first drive voltage;
   one end of the second resistor is connected to the source of the first P-channel field-effect transistor; and
   the other end of the second resistor is connected to the gate of the first P-channel field-effect transistor.

3. The switching circuit according to claim 1, wherein the second switch circuit comprises the second NPN transistor, the third NPN transistor, a controlled voltage source, a third resistor, the second P-channel field-effect transistor, and a fourth resistor;
   the output end of the comparator circuit is connected to a base of the second NPN transistor;
   an emitter of the second NPN transistor is grounded;
   a collector of the second NPN transistor is connected to a base of the third NPN transistor;
   the base of the third NPN transistor is connected to the controlled voltage source;
   an emitter of the third NPN transistor is grounded;
   a collector of the third NPN transistor is connected to one end of the third resistor;
   the other end of the third resistor is connected to a gate of the second P-channel field-effect transistor;
   a source of the second P-channel field-effect transistor is connected to the second drive voltage source;
   a drain of the second P-channel field-effect transistor is configured to output the second drive voltage;
   one end of the fourth resistor is connected to the source of the second P-channel field-effect transistor; and
   the other end of the fourth resistor is connected to the gate of the second P-channel field-effect transistor.

4. The switching circuit according to claim 2, wherein the first switch circuit further comprises a fifth resistor and a first capacitor;
   the fifth resistor is connected in series between the output end of the comparator circuit and the base of the first NPN transistor; and
   one end of the first capacitor is connected to the base of the first NPN transistor, and the other end of the first capacitor is grounded.

5. The switching circuit according to claim 3, wherein the second switch circuit further comprises a sixth resistor and a second capacitor;
   the sixth resistor is connected in series between the collector of the second NPN transistor and the base of the third NPN transistor; and
   one end of the second capacitor is connected to the base of the third NPN transistor, and the other end of the second capacitor is grounded.

6. The switching circuit according to claim 1, wherein the reference voltage is generated in a manner of a low dropout regulator LDO or pulse width modulation PWM.

7. An electronic device, comprising a processor, a connector, and a switching circuit, wherein:
   the processor is separately connected to an output end of a first switch circuit and an output end of a second switch circuit in the switching circuit; the connector is connected to a first input end of a comparator circuit in the switching circuit; and
   the switching circuit comprises the comparator circuit, the first switch circuit, the second switch circuit, a first drive voltage source, and a second drive voltage source, wherein the comparator circuit comprises a first input end, a second input end, and an output end; the first switch circuit and the second switch circuit both comprise an input end, an output end, and a drive end;

the first input end of the comparator circuit is configured to receive an input voltage;

the second input end of the comparator circuit is configured to receive a reference voltage;

the output end of the comparator circuit is separately connected to the input end of the first switch circuit and the input end of the second switch circuit;

the drive end of the first switch circuit is connected to the first drive voltage source;

the drive end of the second switch circuit is connected to the second drive voltage source;

the comparator circuit is configured to determine whether the input voltage is greater than the reference voltage; output a high level if it is determined that the input voltage is greater than the reference voltage; and output a low level if it is determined that the input voltage is not greater than the reference voltage;

the first switch circuit is configured to, when the comparator circuit outputs the high level, switch on and output, by using the output end of the first switch circuit, a first drive voltage provided by the first drive voltage source; and switch off when the comparator circuit outputs the low level; and the second switch circuit is configured to, when the comparator circuit outputs the low level, switch on and output, by using the output end of the second switch circuit, a second drive voltage provided by the second drive voltage source; and switch off when the comparator circuit outputs the high level, wherein the first switch circuit comprises a first NPN transistor and a first P-channel field-effect transistor, the first NPN transistor is configured to receive output of the comparator circuit to control conductance of the first P-channel field-effect transistor, and thus control conductance of the first switch circuit, wherein the second switch circuit comprises a second NPN transistor, a third NPN transistor and a second P-channel field-effect transistor, the second NPN transistor is configured to receive the output of the comparator circuit to control conductance of the third NPN transistor and the second P-channel field-effect transistor, and thus control conductance of the second switch circuit.

8. The electronic device according to claim 7, wherein:
the connector is configured to receive an input signal from an image sensor board, and transmit the input signal to the switching circuit.

9. The electronic device according to claim 7, wherein the processor comprises an image processing chip.

10. The electronic device according to claim 8, wherein the input signal of the image sensor board is configured to control a working voltage of the processor in the electronic device.

* * * * *